US011354231B2

(12) United States Patent
Yang

(10) Patent No.: US 11,354,231 B2
(45) Date of Patent: Jun. 7, 2022

(54) METHOD FOR PERFORMING ACCESS MANAGEMENT OF MEMORY DEVICE WITH AID OF INFORMATION ARRANGEMENT, ASSOCIATED MEMORY DEVICE AND CONTROLLER THEREOF, ASSOCIATED ELECTRONIC DEVICE

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 245 days.

(21) Appl. No.: 16/427,293

(22) Filed: May 30, 2019

(65) Prior Publication Data

US 2020/0379898 A1 Dec. 3, 2020

(51) Int. Cl.
*G06F 12/02* (2006.01)
*G11C 11/56* (2006.01)
*G06F 3/06* (2006.01)
*G06F 11/10* (2006.01)

(52) U.S. Cl.
CPC .......... *G06F 12/0246* (2013.01); *G06F 3/064* (2013.01); *G06F 3/0658* (2013.01); *G06F 3/0659* (2013.01); *G06F 3/0679* (2013.01); *G06F 11/1072* (2013.01); *G11C 11/5628* (2013.01); *G11C 11/5642* (2013.01)

(58) Field of Classification Search
CPC ...... G06F 3/064; G06F 3/0658; G06F 3/0659; G06F 3/0679; G06F 3/0688; G06F 3/061; G06F 3/614; G06F 11/1072; G06F 11/1048; G06F 11/1068; G06F 11/108; G06F 2212/7201; G06F 2212/7209; G11C 11/5628; G11C 11/5642; G11C 16/0483
See application file for complete search history.

(56) References Cited

U.S. PATENT DOCUMENTS

| 7,237,062 B2 * | 6/2007 | Lubbers ................ G06F 3/0619 |
| | | 711/114 |
| 8,495,460 B2 | 7/2013 | Flynn |
| 10,025,662 B2 | 7/2018 | Yang |

(Continued)

FOREIGN PATENT DOCUMENTS

TW    I658364 B    5/2019

*Primary Examiner* — Kalpit Parikh
(74) *Attorney, Agent, or Firm* — Winston Hsu

(57) ABSTRACT

A method for performing access management of a memory device with aid of information arrangement and associated apparatus (e.g. the memory device and controller thereof, and an associated electronic device) are provided. The method may include: when the host device sends a write command to the memory device, utilizing the memory controller to generate a plurality of ECC chunks respectively corresponding to a plurality of sets of memory cells of the NV memory according to data, for establishing one-to-one mapping between the plurality of ECC chunks and the plurality of sets of memory cells; and utilizing the memory controller to store the plurality of ECC chunks into the plurality of sets of memory cells, respectively, to prevent any two ECC chunks of the ECC chunks from sharing a same set of memory cells of the sets of memory cells, to enhance read performance of the memory controller regarding the data.

16 Claims, 10 Drawing Sheets

(56) References Cited

U.S. PATENT DOCUMENTS

| | | | |
|---|---|---|---|
| 2007/0180346 A1* | 8/2007 | Murin | G11C 16/0483 |
| | | | 714/755 |
| 2008/0301532 A1* | 12/2008 | Uchikawa | G11C 29/52 |
| | | | 714/773 |
| 2013/0145085 A1* | 6/2013 | Yu | G06F 12/0246 |
| | | | 711/103 |
| 2014/0006898 A1* | 1/2014 | Sharon | G06F 11/1072 |
| | | | 714/755 |
| 2014/0095959 A1 | 4/2014 | Flynn | |
| 2017/0249242 A1 | 8/2017 | Thatcher | |

* cited by examiner

METHOD FOR PERFORMING ACCESS MANAGEMENT OF MEMORY DEVICE WITH AID OF INFORMATION ARRANGEMENT, ASSOCIATED MEMORY DEVICE AND CONTROLLER THEREOF, ASSOCIATED ELECTRONIC DEVICE

BACKGROUND OF THE INVENTION

1. Field of the Invention

The present invention relates to access control of flash memory, and more particularly, to a method for performing access management of a memory device with aid of information arrangement, and associated apparatus (e.g. the memory device and controller thereof such as a memory controller within the memory device, and an associated electronic device).

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the UFS and eMMC specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories have been applied to the memory devices, there are some problems such as an increased bit error rate, etc. Although a traditional sensing scheme regarding reading data from the TLC flash memories has been proposed to try solving the problems, it does not work for the memory devices equipped with the quadruple level cell (QLC) flash memories. More particularly, the traditional sensing scheme is not good for high-level per memory cell in the QLC flash memories, and system reliability will be bounded by the weakest page. Thus, a novel method and associated architecture are needed for enhancing overall performance without introducing any side effect or in a way that is less likely to introduce a side effect.

SUMMARY OF THE INVENTION

It is an objective of the present invention to provide a method for performing access management of a memory device with aid of information arrangement, and associated apparatus (e.g. the memory device and controller thereof such as a memory controller within the memory device, and an associated electronic device), in order to solve the above problems.

It is another objective of the present invention to provide a method for performing access management of a memory device with aid of information arrangement, and associated apparatus (e.g. the memory device and controller thereof such as a memory controller within the memory device, and an associated electronic device), in order to enhance overall performance without introducing any side effect or in a way that is less likely to introduce a side effect.

At least one embodiment of the present invention provides a method for performing access management of a memory device with aid of information arrangement. The memory device may comprise a non-volatile (NV) memory and a memory controller for controlling the accessing of the NV memory, and the NV memory may comprise at least one NV memory element (e.g. one or more NV memory elements). The method may comprise: if a host device sends a write command to the memory device, utilizing the memory controller to generate a plurality of error correction code (ECC) chunks respectively corresponding to a plurality of sets of memory cells of the NV memory according to data, for establishing one-to-one mapping between the plurality of ECC chunks and the plurality of sets of memory cells; and utilizing the memory controller to store the plurality of ECC chunks into the plurality of sets of memory cells, respectively, to prevent any two ECC chunks of the plurality of ECC chunks from sharing a same set of memory cells of the plurality of sets of memory cells, to enhance read performance of the memory controller regarding the data.

In addition to the above method, the present invention also provides a memory device, and the memory device comprises a NV memory and a controller. The NV memory is arranged to store information, wherein the NV memory may comprise at least one NV memory element (e.g. one or more NV memory elements). The controller is coupled to the NV memory, and the controller is arranged to control operations of the memory device. In addition, the controller comprises a processing circuit that is arranged to control the controller according to a plurality of host commands from a host device to allow the host device to access the NV memory through the controller. For example, if the host device sends a write command to the memory device, the controller generates a plurality of ECC chunks respectively corresponding to a plurality of sets of memory cells of the NV memory according to data, for establishing one-to-one mapping between the plurality of ECC chunks and the plurality of sets of memory cells, wherein the plurality of host commands comprises the write command. Additionally, the controller stores the plurality of ECC chunks into the plurality of sets of memory cells, respectively, to prevent any two ECC chunks of the plurality of ECC chunks from sharing a same set of memory cells of the plurality of sets of memory cells, to enhance read performance of the memory controller regarding the data.

According to some embodiments, an associated electronic device is also provided. The electronic device may comprise the above memory device, and may further comprise: the host device, coupled to the memory device. The host device may comprise: at least one processor, arranged for controlling operations of the host device; and a power supply circuit, coupled to the at least one processor, arranged for providing power to the at least one processor and the memory device. In addition, the memory device may provide the host device with storage space.

In addition to the above method, the present invention also provides a controller of a memory device, where the memory device comprises the controller and a NV memory. The NV memory may comprise at least one NV memory element (e.g. one or more NV memory elements). In addition, the controller comprises a processing circuit that is arranged to control the controller according to a plurality of host commands from a host device, to allow the host device to access the NV memory through the controller. For example, if the host device sends a write command to the memory device, the controller generates a plurality of ECC chunks respectively corresponding to a plurality of sets of memory cells of the NV memory according to data, for establishing one-to-one mapping between the plurality of ECC chunks and the plurality of sets of memory cells, wherein the plurality of host commands comprises the write command. Additionally, the controller stores the plurality of ECC chunks into the plurality of sets of memory cells, respectively, to prevent any two ECC chunks of the plurality of ECC chunks from sharing a same set of memory cells of the plurality of sets of memory cells, to enhance read performance of the memory controller regarding the data.

The present invention method and associated apparatus can guarantee that the whole system (e.g. the host device and the memory device) can operate properly, to prevent problems in the related art, such as the increased bit error rate, degraded system reliability due to the weakest page, etc. In addition, implementing the embodiments of the present invention does not significantly increase additional costs. Therefore, the related art problems can be solved, and the overall cost will not increase too much. In comparison with the related art, the present invention method and associated apparatus can enhance overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
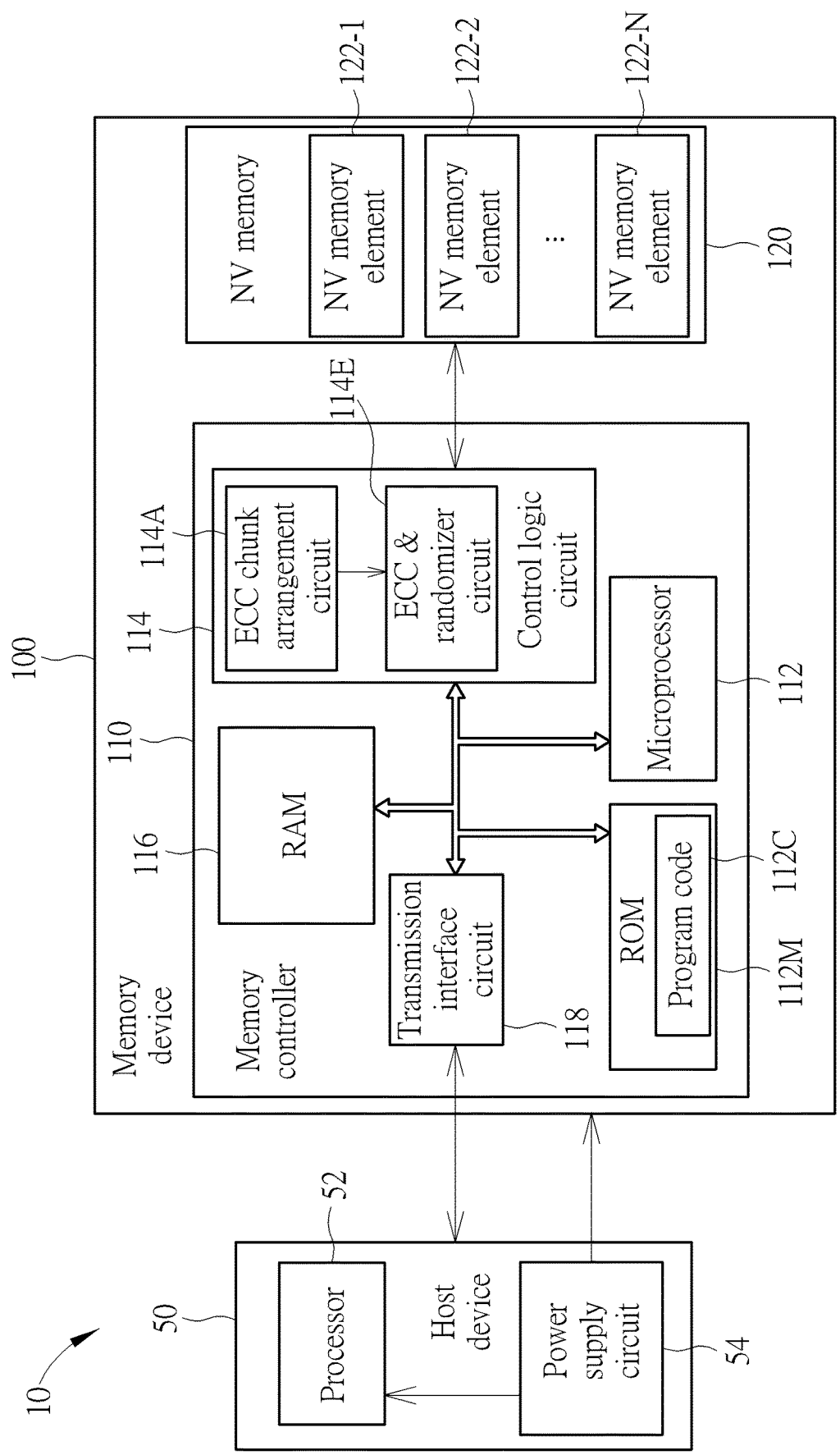
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a controller such as a memory controller 110, and may further comprise a non-volatile (NV) memory 120, where the controller is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise a data protection circuit for protecting data and/or performing error correction, where the data protection circuit may comprise a plurality of sub-circuits such as an error correction code (ECC) chunk arrangement circuit 114A, an ECC and randomizer circuit 114E (labeled "ECC & randomizer circuit" in FIG. 1), etc., but the present invention is not limited thereto. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, Universal Flash Storage (UFS) specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programing, etc. on memory units (e.g. data pages) having physical addresses within the flash memory 120, where the physical addresses correspond to the logical addresses. When the memory controller 110 perform an erase operation on any NV memory element 122-$n$ of the plurality of NV memory elements 122-1, 122-2, . . . , and 122-N (in which "n" may represent any integer in the interval [1, N]), at least one block of multiple blocks of the NV memory element 122-$n$ may be erased, where each block of the blocks may comprise multiple pages (e.g. data pages), and an access operation (e.g. reading or writing) may be performed on one or more pages.

Figure 2:
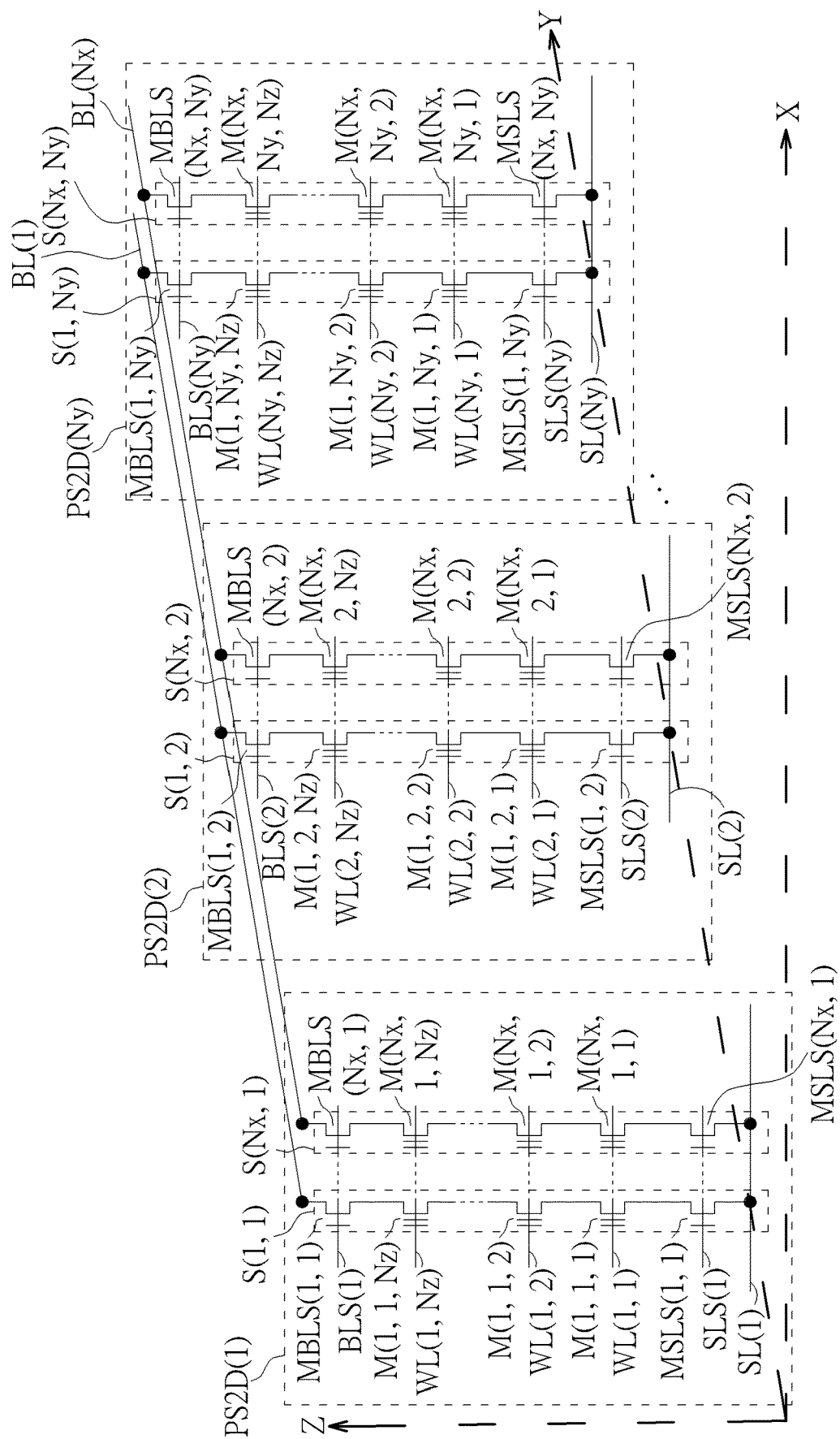
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one NV memory element (e.g. the one or more NV memory elements), such as each memory element within the plurality of NV memory elements 122-1, 122-2, . . . , and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), . . . , M(Nx, 1, 1)}, {M(1, 2, 1), . . . , M(Nx, 2, 1)}, . . . , {M(1, Ny, 1), . . . , M(Nx, Ny, 1)}}, {{M(1, 1, 2), . . . , M(Nx, 1, 2)}, {M(1, 2, 2), . . . , M(Nx, 2, 2)}, . . . , {M(1, Ny, 2), . . . , M(Nx, Ny, 2)}}, . . . , and {{M(1, 1, Nz), . . . , M(Nx, 1, Nz)}, {M(1, 2, Nz), . . . , M(Nx, 2, Nz)}, . . . , {M(1, Ny, Nz), . . . , M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS (1, 1), . . . , MBLS(Nx, 1)}, {MBLS(1, 2), . . . , MBLS(Nx, 2)}, . . . , and {MBLS(1, Ny), . . . , MBLS(Nx, Ny)} that are arranged in an upper layer above the Nz layers and (Nx*Ny) lower selector circuits {MSLS(1, 1), . . . , MSLS(Nx, 1)}, {MSLS(1, 2), . . . , MSLS(Nx, 2)}, . . . , and {MSLS(1, Ny), MSLS(Nx, Ny)} that are arranged in a lower layer below the Nz layers. In addition, the 3D NAND flash memory may comprise a plurality of bit lines and a plurality of word lines for access control, such as Nx bit lines BL(1), . . . , and BL(Nx) that are arranged in a top layer above the upper layer and (Ny*Nz) word lines {WL(1, 1), WL(2, 1), . . . , WL(Ny, 1)}, {WL(1, 2), WL(2, 2), . . . , WL(Ny, 2)}, . . . , and {WL(1, Nz), WL(2, Nz), . . . , WL(Ny, Nz)} that are respectively arranged in the Nz layers. Additionally, the 3D NAND flash memory may comprise a plurality of selection lines for selection control, such as Ny upper selection lines BLS(1), BLS(2), . . . , and BLS(Ny) that are arranged in the upper layer and Ny lower selection lines SLS(1), SLS(2), . . . , and SLS(Ny) that are arranged in the lower layer, and may further comprise a plurality of source lines for providing reference levels, such as Ny source lines SL(1), SL(2), . . . , and SL(Ny) that are arranged in a bottom layer below the lower layer.

As shown in FIG. 2, the 3D NAND flash memory may be divided into Ny circuit modules PS2D (1), PS2D (2), . . . , and PS2D (Ny) distributed along the Y-axis. For better comprehension, the circuit modules PS2D(1), PS2D(2), . . . , and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), . . . , and PS2D(Ny) may comprise Nx secondary circuit modules S(1, ny), . . . , and S(Nx, ny), where "ny" may represent any integer in the interval [1, Ny]. For example, the circuit module PS2D(1) may comprise Nx secondary circuit modules S(1, 1), . . . , and S(Nx, 1), the circuit module PS2D(2) may comprise Nx secondary circuit modules S(1, 2), . . . , and S(Nx, 2), . . . , and the circuit module PS2D (Ny) may comprise Nx secondary circuit modules S(1, Ny), . . . , and S(Nx, Ny). In the circuit module PS2D (ny), any secondary circuit module S(nx, ny) of the secondary circuit modules S(1, ny), . . . , and S(Nx, ny) may comprise Nz memory cells M(nx, ny, 1), M(nx, ny, 2), . . . , and M(nx, ny, Nz), and may comprise a set of selector circuits corresponding to the memory cells M(nx, ny, 1), M(nx, ny, 2), . . . , and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), . . . , and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), . . . , and M(nx, ny, Nz) may be implemented with a floating gate transistor, where "nz" may represent any integer in the interval [1, Nz], but the present invention is not limited thereto. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

Figure 3:
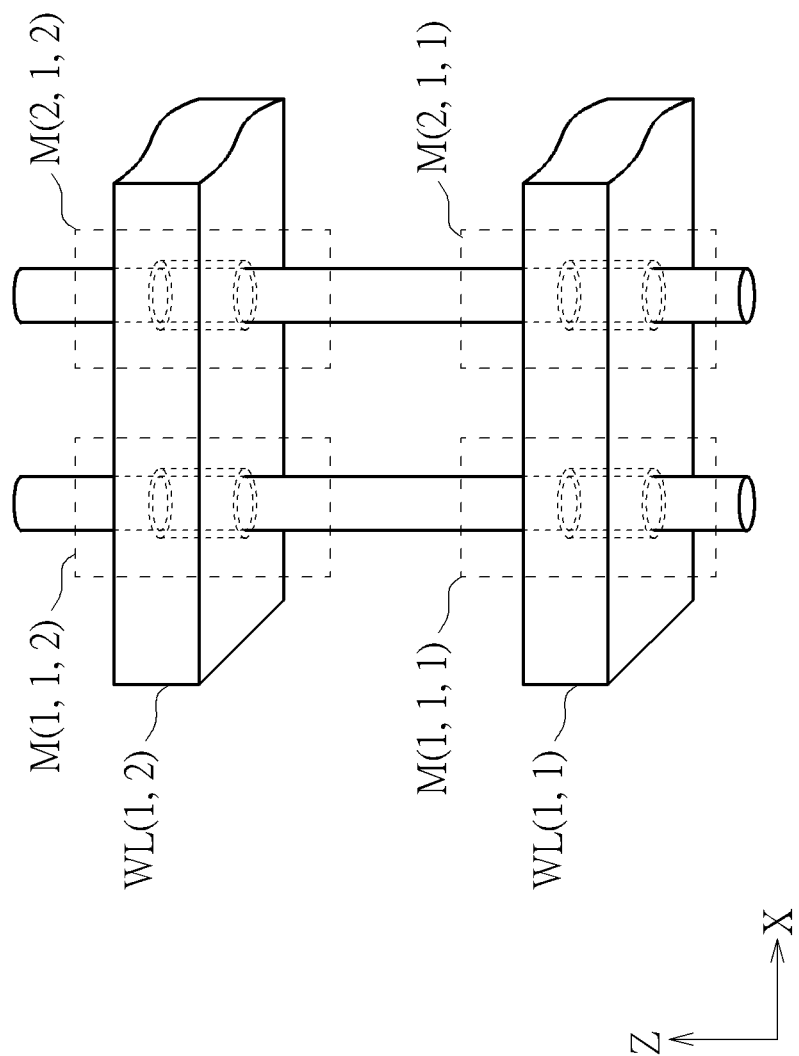
FIG. 3 illustrates some partial structures of the 3D NAND flash memory shown in FIG. 2 according to an embodiment of the present invention.

FIG. 3 illustrates some partial structures of the 3D NAND flash memory shown in FIG. 2 according to an embodiment of the present invention. The 3D NAND flash memory may be designed to have a plurality of rod-shaped partial structures such as that shown in FIG. 3, and the plurality of rod-shaped partial structures may be arranged to pass through the secondary circuit modules {S(1, 1), ..., S(Nx, 1)}, {S(1, 2), ..., S(Nx, 2)}, ..., and {S(1, Ny), S(Nx, Ny)}, respectively. For better comprehension, the plurality of rod-shaped partial structures may be regarded as the channels of the associated transistors of the secondary circuit modules {S(1, 1), S(Nx, 1)}, {S(1, 2), ..., S(Nx, 2)}, ..., and {S(1, Ny), ..., S(Nx, Ny)} within the architecture shown in FIG. 2, respectively, such as the channels of the ordinary transistors for implementing the upper selector circuit MBLS(nx, ny) and the lower selector circuit MSLS(nx, ny) and the channel of the floating gate transistor for implementing the memory cell M(nx, ny, nz). According to some embodiments, the number of the plurality of rod-shaped partial structures may be equal to the total amount (Nx*Ny) of the secondary circuit modules {S(1, 1), ..., S(Nx, 1)}, {S(1, 2), S(Nx, 2)}, ..., and {S(1, Ny), S(Nx, Ny)}, but the present invention is not limited thereto. For example, the arrangement of the plurality of memory cells may be changed, and the number of the plurality of rod-shaped partial structures may be changed correspondingly.

In addition, the 3D NAND flash memory may be designed to have a plurality of pipe-shaped partial structures, and the plurality of pipe-shaped partial structures may be arranged to encircle the plurality of rod-shaped partial structures to form the respective components of the secondary circuit modules {S(1, 1), ..., S(Nx, 1)}, {S(1, 2), ..., S(Nx, 2)}, ..., and {S(1, Ny), ..., S(Nx, Ny)}, and more particularly, to form the respective control gates and the respective floating gates of the plurality of memory cells and the respective gates of the plurality of selector circuits in the architecture shown in FIG. 2. The memory cells {{M(1, 1, 1), M(2, 1, 1), ... }, {M(1, 1, 2), M(2, 1, 2), ... }, ... } and the word lines {WL(1, 1), WL(1, 2), ... } are illustrated in FIG. 3, and the pipe-shaped partial structures shown in FIG. 3 may indicate that there are some additional partial structures surrounding each of the plurality of rod-shaped partial structures, where further details regarding the additional partial structures will be described in the following embodiments.

Figure 4:
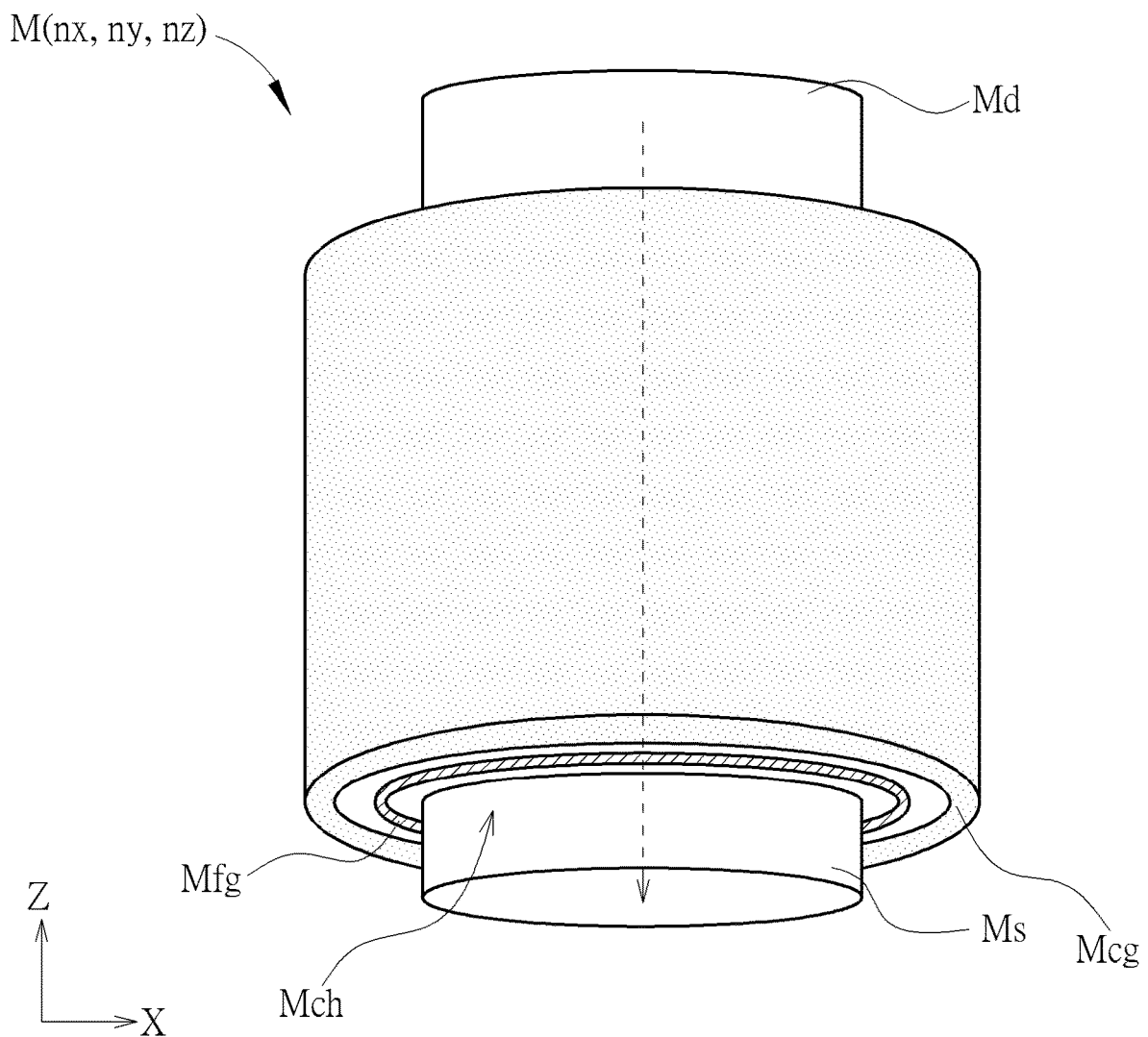
FIG. 4 illustrates some implementation details of one of the memory cells of the 3D NAND flash memory shown in FIG. 2 according to an embodiment of the present invention.

FIG. 4 illustrates some implementation details of one of the memory cells of the 3D NAND flash memory shown in FIG. 2 according to an embodiment of the present invention. As shown in FIG. 4, the memory cell M(nx, ny, nz) may comprise a portion of one of the plurality of rod-shaped partial structures, such as a rod segment within the rod-shaped partial structure corresponding to the secondary circuit module S(nx, ny), and may further comprise some pipe-shaped partial structures having the same symmetry axis. For example, the upper side Md and the lower side Ms of the rod segment may be utilized as the drain and the source of the floating gate transistor for implementing the memory cell M(nx, ny, nz), and a first pipe-shaped partial structure Mfg and a second pipe-shaped partial structure Mcg within these pipe-shaped partial structures may be utilized as the floating gate and the control gate of this floating gate transistor. The other pipe-shaped partial structures within these pipe-shaped partial structures, such as the pipe-shaped partial structure between the rod segment and the first pipe-shaped partial structure Mfg and the pipe-shaped partial structure between the first pipe-shaped partial structure Mfg and the second pipe-shaped partial structure Mcg, may be implemented with one or more insulation materials.

According to some embodiments, any selector circuit of the plurality of selector circuits in the architecture shown in FIG. 2 may be implemented by altering the architecture shown in FIG. 4. For example, the upper side Md and the lower side Ms of the rod segment may be utilized as the drain and the source of the ordinary transistor for implementing this selector circuit, and the second pipe-shaped partial structure Mcg within these pipe-shaped partial structures may be utilized as the gate of the ordinary transistor, where the first pipe-shaped partial structure Mfg should be removed from the one or more insulation materials. As a result, there may be only one pipe-shaped partial structure between the rod segment and the second pipe-shaped partial structure Mcg, but the present invention is not limited thereto.

Figure 5:
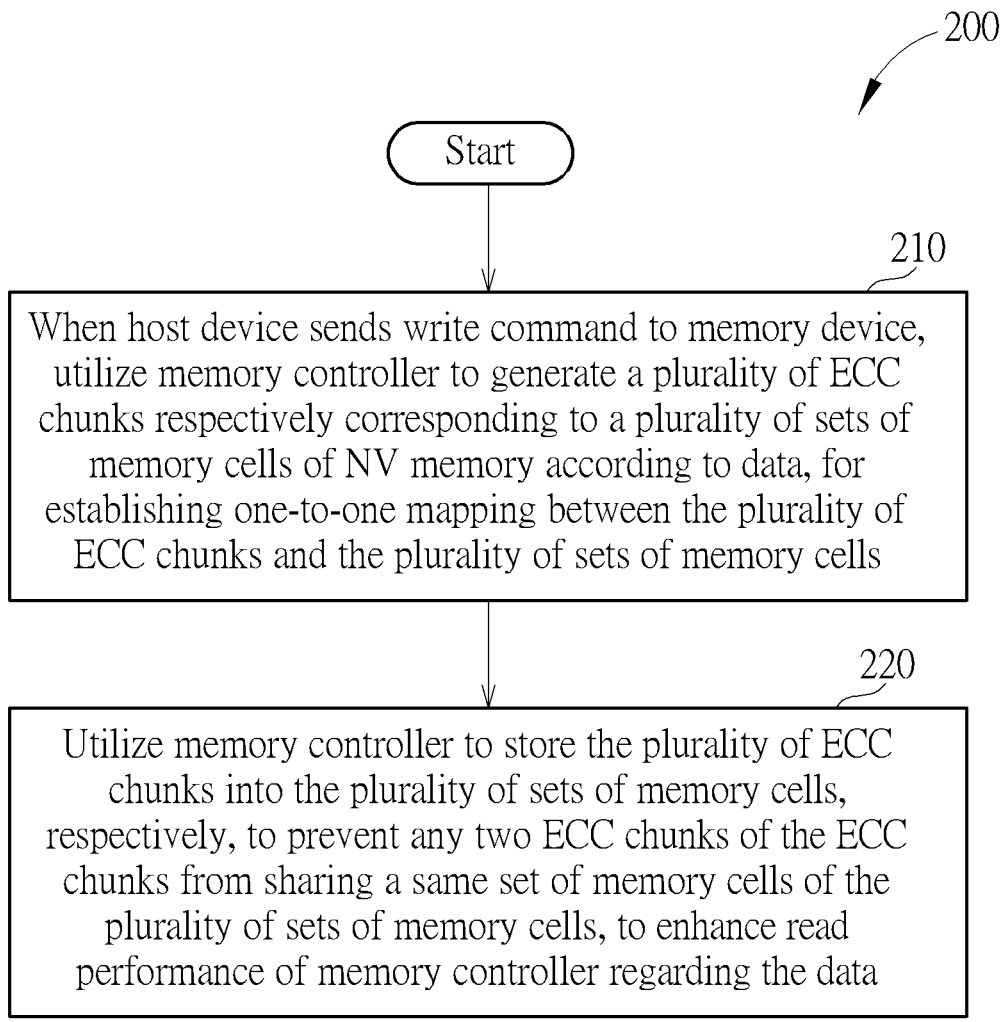
FIG. 5 is a working flow of a method for performing access management of a memory device with aid of information arrangement according to an embodiment of the present invention.

FIG. 5 is a working flow 200 of a method for performing access management of a memory device with aid of information arrangement according to an embodiment of the present invention. The method may be applied to the electronic device 10, the memory device 100, and the memory controller 110 which may be arranged to control the accessing of the NV memory 120. For example, the memory device 100 (e.g. the memory controller 110) may operate according to the method. Based on the method, the memory controller 110 may perform access management of the memory device 100 with aid of the information arrangement.

In Step 210, when the host device 50 sends a write command to the memory device 100, the memory device 100 may utilize the memory controller 110 to generate a plurality of ECC chunks respectively corresponding to a plurality of sets of memory cells of the NV memory 120 according to data, for establishing one-to-one mapping between the plurality of ECC chunks and the plurality of sets of memory cells. According to this embodiment, the plurality of sets of memory cells of the NV memory 120 may represent a series of memory cells corresponding to a certain word line within the word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)}, such as the memory cells M(1, ny, nz), ..., and M(Nx, ny, nz) of the word line WL(ny, nz). For example, the one-to-one mapping may comprise one-to-one mapping relationships between the plurality of ECC chunks and the plurality of sets of memory cells, respectively, such as the mapping relationships between the plurality of ECC chunks and a plurality of groups within the memory cells M(1, ny, nz), ..., and M(Nx, ny, nz) of the word line WL(ny, nz), respectively.

In Step 220, the memory device 100 may utilize the memory controller 110 to store the plurality of ECC chunks into the plurality of sets of memory cells, respectively, to prevent any two ECC chunks of the plurality of ECC chunks from sharing a same set of memory cells of the plurality of sets of memory cells, to enhance read performance of the memory controller 110 regarding the data. For example, in a situation where the plurality of sets of memory cells represent the memory cells M(1, ny, nz), ..., and M(Nx, ny, nz) of the word line WL(ny, nz), the memory controller 110 may store the plurality of ECC chunks into the plurality of groups within the memory cells M(1, ny, nz), and M(Nx, ny, nz) of the word line WL(ny, nz), respectively.

For better comprehension, the method may be illustrated with the working flow 200, but the present invention is not limited thereto. According to some embodiments, one or more steps may be added, deleted, or changed in the working flow 200.

Based on the method, the present invention apparatus (e.g. the electronic device 10, the memory device 100, and the memory controller 110) can enhance the overall performance and prevent the related art problems such as the increased bit error rate, degraded system reliability due to the weakest page, etc. For example, a soft-read mechanism of the memory controller 110 regarding QLC memory cells may control the NV memory 120 to utilize 15 internal sensing points of the NV memory 120 to correctly read the data from the NV memory 120, where the memory cells of each word line within the word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)}, such as the memory cells M(1, ny, nz), ..., and M(Nx, ny, nz) of the word line WL(ny, nz), may be arranged to store four logical pages such as a lower page, a middle page, an upper page, and a top page. For better comprehension, assume that the soft-read mechanism of the memory controller 110 may obtain a sign bit and a soft-bit from the NV memory 120 during a soft-read operation (e.g. a probing operation). Regarding determining the associated soft information regarding the word line WL(ny, nz) during a series of soft-read operations (e.g. probing operations), a long time period such as the total internal read busy time of the NV memory 120 may be needed. For example, the number of internal read busy time periods may correspond to the number of threshold voltages (Vth) for distinguishing 16 possible voltage levels of a QLC memory cell, and the total internal read busy time may be a multiple of the summation of the internal read busy time periods, such as (15*3), but the present invention is not limited thereto. If the Vth-distribution is shifted due to some reasons, performing another read to identify the Vth-shifting amount may be required, in order to obtain the soft information for correctly determining the bit information of the QLC memory cell, such as the four bits corresponding to one of the 16 possible voltage levels. Please note that the logic bit-to-physical cell mapping in the related art are not good for high-level per memory cell in the QLC flash memories. The present invention method and the associated architecture can perform the information arrangement such as bit re-allocation to enhance the system reliability, and can enhance the overall performance without introducing any side effect or in a way that is less likely to introduce a side effect.

Figure 6:
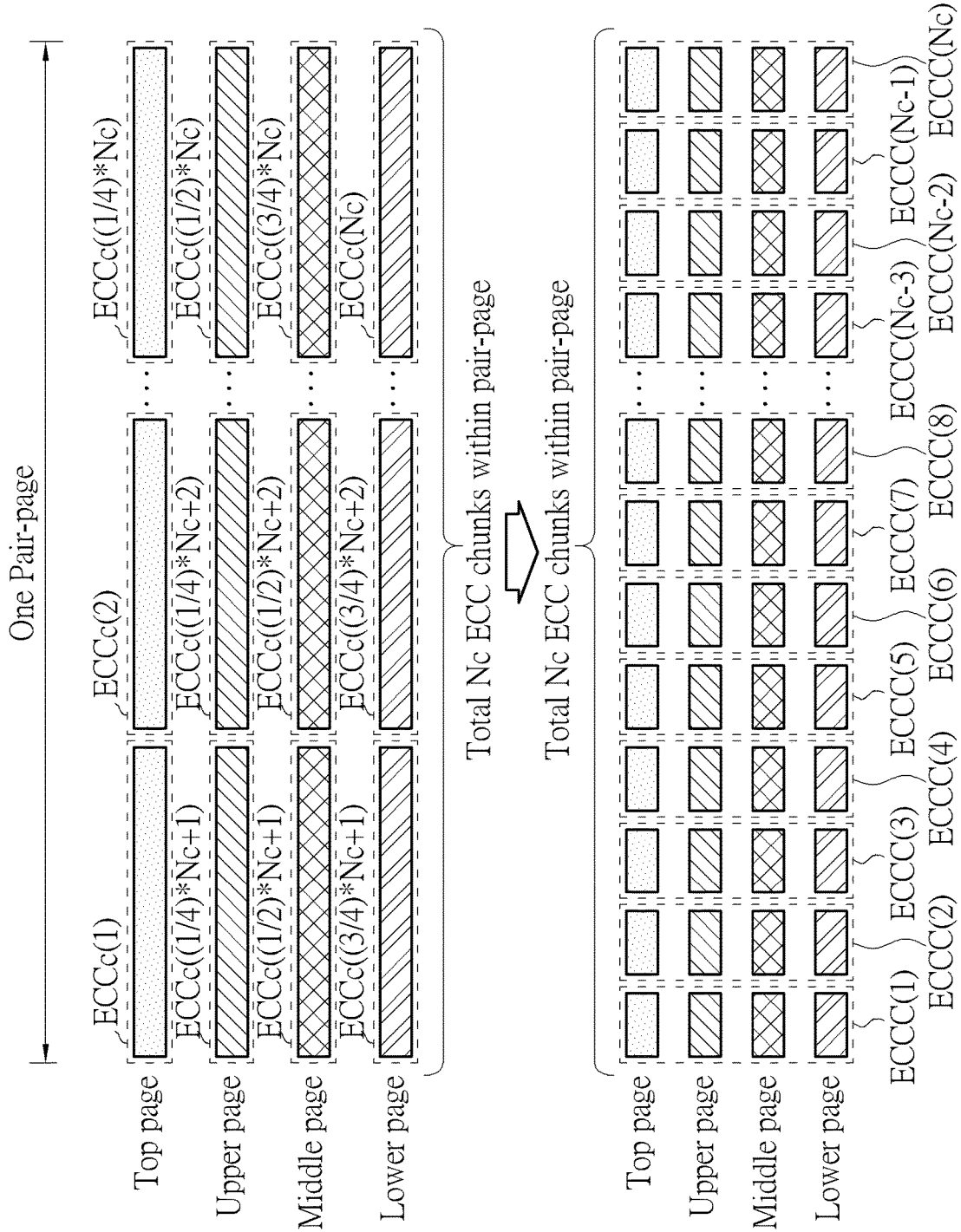
FIG. 6 illustrates, in the lower half thereof, a chunk arrangement control scheme of the method according to an embodiment of the present invention, where another chunk arrangement control scheme is also illustrated for better comprehension.

FIG. 6 illustrates, in the lower half thereof, a chunk arrangement control scheme of the method according to an embodiment of the present invention, where another chunk arrangement control scheme is also illustrated for better comprehension. According to this embodiment, each memory cell within the plurality of sets of memory cells is arranged to store a plurality of bits such as four bits, where the four bits may belong to the four logical pages, respectively. In addition, the plurality of sets of memory cells may be arranged to store a hybrid page corresponding to a set of logical pages such as the four logical pages. For example, in a situation where the plurality of sets of memory cells represent the memory cells M(1, ny, nz), ..., and M(Nx, ny, nz) of the word line WL(ny, nz), these memory cells may store the hybrid page, and the respective bits of these memory cells may be regarded as the four logical pages. The hybrid page of this embodiment may be referred to as the pair-page, and therefore, some ECC chunks regarding one pair-page may be illustrated, but the present invention is not limited thereto.

Assume that the data may be protected with four sets of ECC chunks {ECCc(1), ECCc(2), ..., ECCc((¼)*Nc)}, {ECCc((¼)*Nc+1), ECCc((¼)*Nc+2), ..., ECCc((½)*Nc)}, {ECCc((½)*Nc+1), ECCc((½)*Nc+2), ..., ECCc((¾)*Nc)}, and {ECCc((¾)*Nc+1), ECCc((¾)*Nc+2), ..., ECCc(Nc)} respectively corresponding to the four logical pages (e.g. the lower page, the middle page, the upper page, and the top page), such as the Nc ECC chunks shown in the upper half of FIG. 6, where "Nc" may represent a positive integer that is greater than one. According to this embodiment, Nc is a multiple of four. The data may be divided into Nc subsets thereof, and the Nc subsets of the data may be protected with the respective parity information of the ECC chunks {ECCc(1), ECCc(2), ..., ECCc((¼)*Nc)}, {ECCc((¼)*Nc+1), ECCc((¼)*Nc+2), ..., ECCc((½)*Nc)}, {ECCc((½)*Nc+1), ECCc((½)*Nc+2), ..., ECCc((¾)*Nc)}, and {ECCc((¾)*Nc+1), ECCc((¾)*Nc+2), ..., ECCc(Nc)}. As one of the four logical pages may be a weakest page in the hybrid page (e.g. one pair-page), a long time period such as the total internal read busy time of the NV memory 120 may be needed due to the chunk arrangement shown in the upper half of FIG. 6.

As shown in the lower half of FIG. 6, the memory controller 110 may generate a series of ECC chunks ECCC(1), ECCC(2), ECCC(3), ECCC(4), ECCC(5), ECCC(6), ECCC(7), ECCC(8), ..., ECCC(Nc−3), ECCC(Nc−2), ECCC(Nc−1), and ECCC(Nc) as the plurality of ECC chunks respectively corresponding to the plurality of sets of memory cells in Step 210. According to this embodiment, the memory controller 110 may protect the data with the series of ECC chunks ECCC(1), ECCC(2), ECCC(3), ECCC(4), ECCC(5), ECCC(6), ECCC(7), ECCC(8), ..., ECCC(Nc−3), ECCC(Nc−2), ECCC(Nc−1), and ECCC(Nc) respectively corresponding to the plurality of sets of memory cells (e.g. the plurality of groups within the memory cells M(1, ny, nz), ..., and M(Nx, ny, nz) of the word line WL(ny, nz)), where the chunk count Nc of these ECC chunks may be equal to the set count of the plurality of sets of memory cells (e.g. the group count of the plurality of groups within the memory cells M(1, ny, nz), ..., and M(Nx, ny, nz) of the word line WL(ny, nz)), but the present invention is not limited thereto. For example, any ECC chunk of the plurality of ECC chunks mentioned in Step 210, such as an ECC chunk ECCC(nc) within the series of ECC chunks ECCC(1), ECCC(2), ECCC(3), ECCC(4), ECCC(5), ECCC(6), ECCC(7), ECCC(8), ..., ECCC(Nc−3), ECCC(Nc−2), ECCC(Nc−1), and ECCC(Nc), may comprise respective bits of a set of memory cells within the plurality of sets of memory cells, such as the respective bits of a group of the plurality of groups within the memory cells M(1, ny, nz), ..., and M(Nx, ny, nz) of the word line WL(ny, nz), where "nc" may represent any integer in the interval [1, Nc]. More particularly, the ECC chunk ECCC(nc) may be the nc-th ECC chunk within these ECC chunks, and the group may be the nc-th group within the plurality of groups.

According to some embodiments, any ECC chunk of the plurality of ECC chunks mentioned in Step 210, such as the ECC chunk ECCC(nc), may comprise a two-dimensional (2D) array of bit information formed with the respective bits of the set of memory cells within the plurality of sets of memory cells, such as the 2D array of bit information formed with the respective bits of the group of the plurality of groups. For example, the ECC chunk ECCC(nc) may be the nc-th ECC chunk, and the group may be the nc-th group within the plurality of groups.

According to some embodiments, regarding the chunk arrangement control scheme shown in the lower half of FIG. 6, Nc is not limited to be a multiple of four. As long as implementation of the chunk arrangement control scheme is not hindered, Nc may be any integer greater than one.

Figure 7:
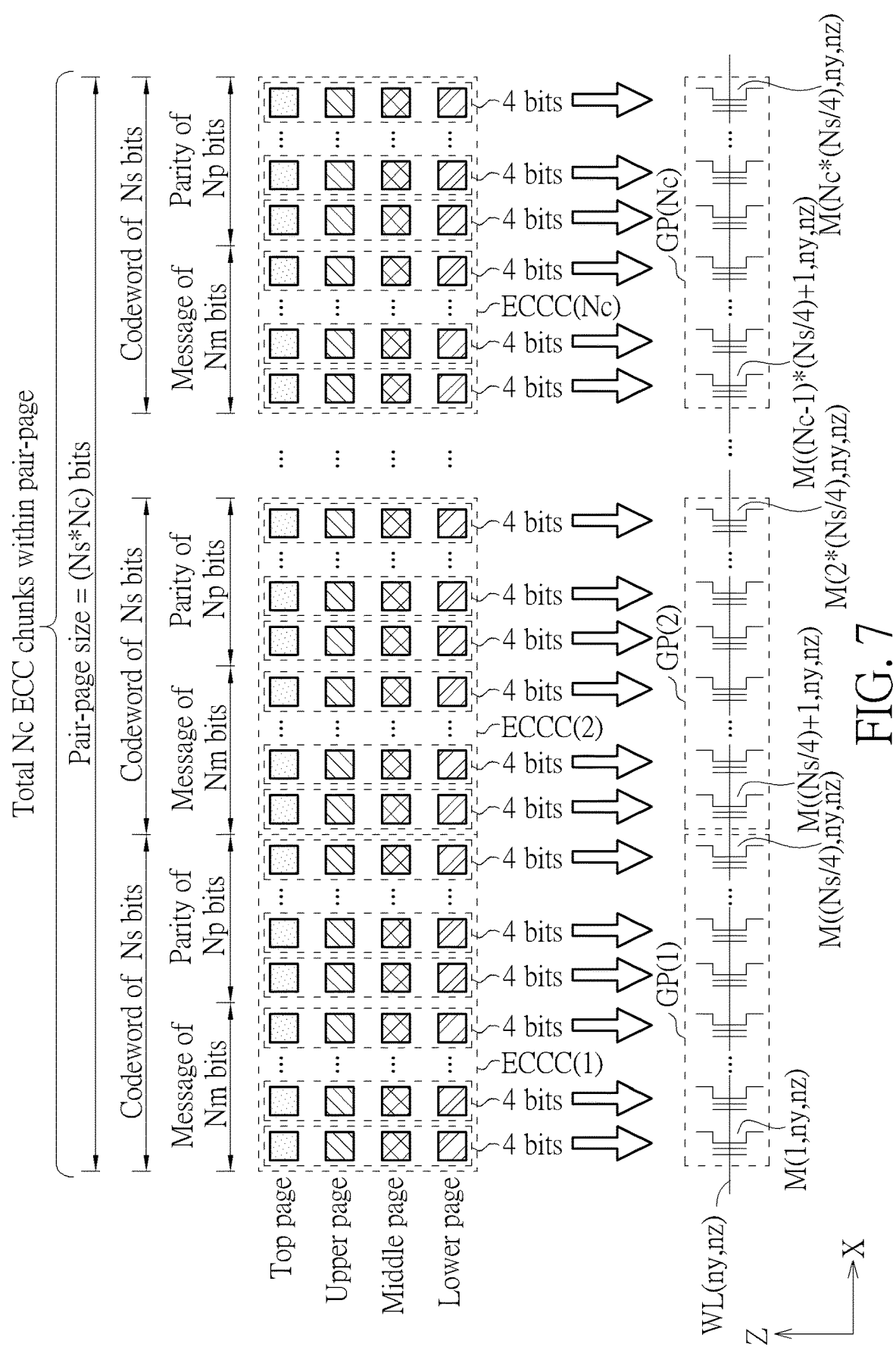
FIG. 7 illustrates a bit arrangement control scheme of the method according to an embodiment of the present invention.

FIG. 7 illustrates a bit arrangement control scheme of the method according to an embodiment of the present invention. The ECC chunk ECCC(nc) such as any of the Nc ECC chunks ECCC(1), ECCC(2), and ECCC(Nc) shown in FIG. 7 may comprise a codeword of Ns bits (or Ns-bit-codeword), and the codeword of Ns bits may comprise a message of Nm bits (or Nm-bit-message), and may further comprise a parity of Np bits (or Np-bit-parity), such as a parity code of Np bits (or Np-bit-parity code), where Ns=Nm+Np, and each of Ns, Nm, and Np may be an integer greater than one. According to this embodiment, Ns is a multiple of four, and preferably, each of Nm and Np may be a multiple of four. The respective Nm-bit-messages of the Nc ECC chunks ECCC(1), ECCC(2), . . . , and ECCC(Nc) may be taken as examples of the Nc subsets of the data in the embodiment shown in FIG. 6. In addition, the series of 4-bit information in any ECC chunks of the Nc ECC chunks ECCC(1), ECCC(2), . . . , and ECCC(Nc), such as multiple columns of 4 bits in the ECC chunk ECCC(nc) (e.g. 4 bits per column, as shown in FIG. 7), may be taken as an example of the respective bits of the set of memory cells within the plurality of sets of memory cells, and the array formed with the multiple columns of 4 bits in the ECC chunk ECCC(nc) may be taken as an example of the 2D array of bit information.

For better comprehension, the plurality of groups within the memory cells M(1, ny, nz), . . . , and M(Nx, ny, nz) of the word line WL(ny, nz) may be illustrated as the Nc groups of memory cells GP(1), GP(2), and GP(Nc) shown in the bottommost of FIG. 7, respectively, but the present invention is not limited thereto. The Nc groups of memory cells GP(1), GP(2), . . . , and GP(Nc) may be taken as examples of the plurality of sets of memory cells mentioned in Step 210, respectively. As shown in FIG. 7, the first group of memory cells GP(1) may comprise the memory cells M(1, ny, nz), . . . , and M((Ns/4), ny, nz), the second group of memory cells GP(2) may comprise the memory cells M((Ns/4)+1, ny, nz), . . . , and M(2*(Ns/4), ny, nz), . . . , and the Nc-th group of memory cells GP(Nc) may comprise the memory cells M((Nc−1)*(Ns/4)+1, ny, nz), . . . , and M(Nc*(Ns/4), ny, nz). In addition, the size of the hybrid page (e.g. the pair-page) may be equal to (Ns*Nc) bits (labeled "Pair-page size=(Ns*Nc) bits" in FIG. 7, for brevity), and the hybrid page (e.g. the pair-page) may be stored as the Nc ECC chunks ECCC(1), ECCC(2), . . . , and ECCC(Nc) (labeled "Total Nc ECC chunks within pair-page" in FIG. 7, for brevity). As the plurality of sets of memory cells such as the Nc groups of memory cells GP(1), GP(2), . . . , and GP(Nc) may be arranged to store the hybrid page (e.g. the pair-page), and as the hybrid page may correspond to the four logical pages (e.g. the lower page, the middle page, the upper page, and the top page), the total bit count (Ns*Nc) of the hybrid page (e.g. the pair-page) may be four times the total memory cell count (Nc*(Ns/4)) of the Nc groups of memory cells GP(1), GP(2), . . . , and GP(Nc).

According to this embodiment, the memory controller 110 may control the NV memory 120 to access the plurality of sets of memory cells such as the Nc groups of memory cells GP(1), GP(2), . . . , and GP(Nc) through the same word line WL(ny, nz) of the plurality of word lines within the NV memory 120. More particularly, the memory controller 110 may control the NV memory 120 to access the plurality of sets of memory cells through the plurality of bit lines (e.g. the Nx bit lines BL(1), . . . , and BL(Nx)) within the NV memory 120, respectively. In addition, the memory controller 110 may control the NV memory 120 to access any memory cell within the plurality of sets of memory cells through a corresponding bit line of the plurality of bit lines (e.g. the Nx bit lines BL(1), . . . , and BL(Nx)) within the NV memory 120. For example, the total memory cell count (Nc*(Ns/4)) of the Nc groups of memory cells GP(1), GP(2), . . . , and GP(Nc) may be equal to Nx, and the plurality of sets of memory cells such as the Nc groups of memory cells GP(1), GP(2), . . . , and GP(Nc) may comprise the memory cells M(1, ny, nz), . . . , and M(Nx, ny, nz) of the word line WL(ny, nz), but the present invention is not limited thereto. The memory controller 110 may control the NV memory 120 to access any memory cell within the plurality of sets of memory cells, such as a memory cell of the Nc groups of memory cells GP(1), GP(2), . . . , and GP(Nc), and more particularly, access the memory cell M(nx, ny, nz) through the corresponding word line WL(ny, nz) and the corresponding bit line BL(nx).

According to some embodiments, in a situation where the plurality of sets of memory cells is arranged to store the hybrid page corresponding to the set of logical pages, a first bit of a first logical page within the set of logical pages and a first bit of a second logical page within the set of logical pages may be arranged to store in a same memory cell within the plurality of sets of memory cells mentioned in Step 210. More particularly, the first bit of the first logical page, the first bit of the second logical page, and at least one first bit of at least one other logical page within the set of logical pages may be arranged to store in the same memory cell. For example, based on the bit arrangement control scheme shown in FIG. 7, the set of logical pages may comprise the four logical pages such as the lower page, the middle page, the upper page, and the top page. As shown in FIG. 7, the respective first bits of the four logical pages are store in the same memory cell such as the first memory cell M(1, ny, nz) within the memory cells M(1, ny, nz), . . . , and M(Nx, ny, nz) of the word line WL(ny, nz). Similarly, the respective nx-th bits of the four logical pages are store in the same memory cell such as the nx-th memory cell M(nx, ny, nz) within the memory cells M(1, ny, nz), . . . , and M(Nx, ny, nz) of the word line WL(ny, nz). For example, the respective second bits of the four logical pages are store in the same memory cell such as the second memory cell M(2, ny, nz) within the memory cells M(1, ny, nz), . . . , and M(Nx, ny, nz) of the word line WL(ny, nz).

According to some embodiments, the memory controller 110 may control the NV memory 120 to access any memory cell within the plurality of sets of memory cells mentioned in Step 210 through the corresponding bit line of the plurality of bit lines within the NV memory 120. For example, the aforementioned any memory cell within the plurality of sets of memory cells may be arranged to store a plurality of bits such as that mentioned above. For brevity, similar descriptions for these embodiments are not repeated in detail here.

Figure 8:
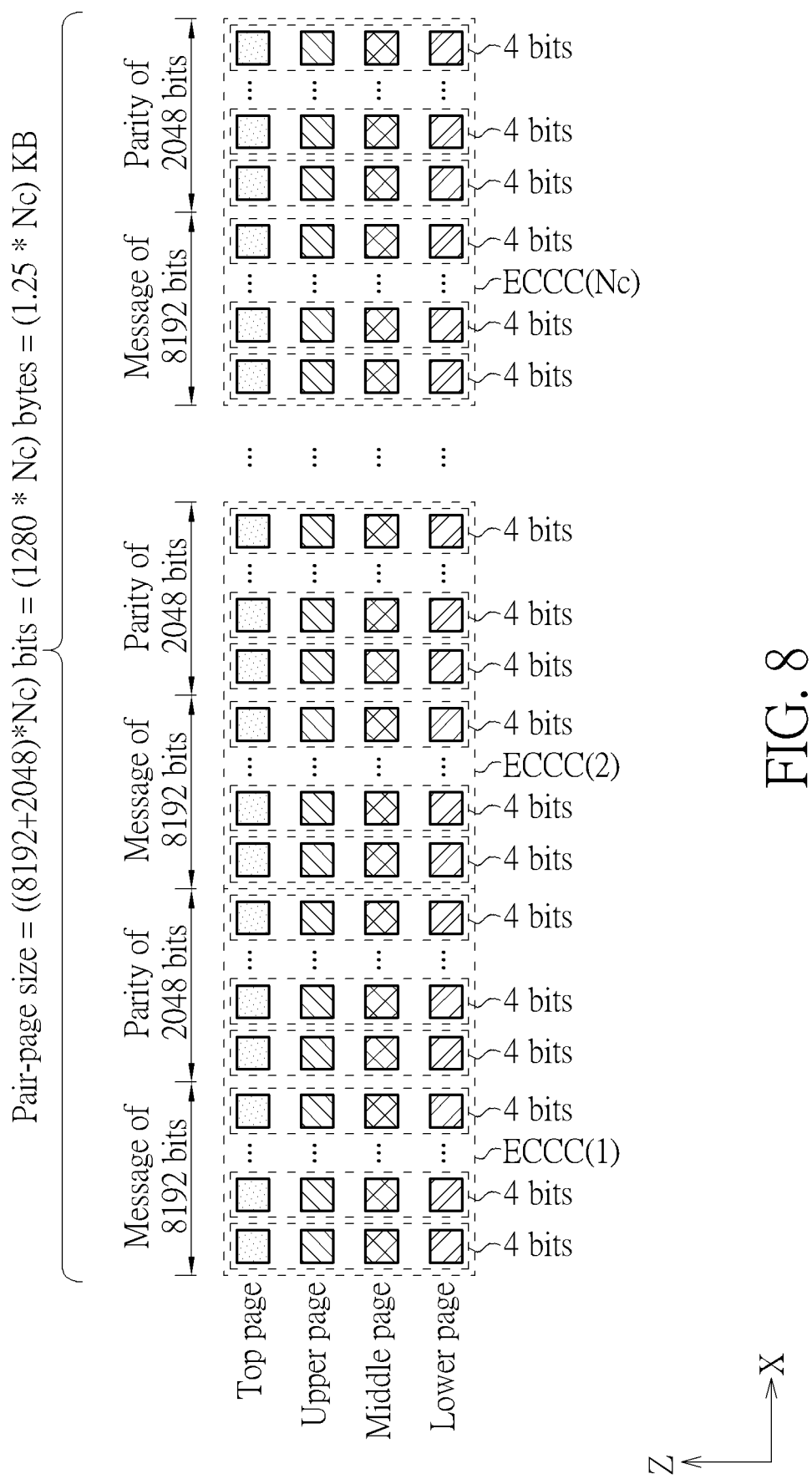
FIG. 8 illustrates some implementation details of the bit arrangement control scheme shown in FIG. 7 according to an embodiment of the present invention.

FIG. 8 illustrates some implementation details of the bit arrangement control scheme shown in FIG. 7 according to an embodiment of the present invention. The ECC chunk ECCC(nc) such as any of the Nc ECC chunks ECCC(1), ECCC(2), . . . , and ECCC(Nc) shown in FIG. 8 may comprise a codeword of 10240 bits (or 10240-bit-codeword), and the codeword of 10240 bits may comprise a message of 8192 bits (or 8192-bit-message), and may further comprise a parity of 2048 bits (or 2048-bit-parity), such as a parity code of 2048 bits (or 2048-bit-parity code), where Nm=8192 and Np=2048. As a result, the hybrid page size such as the pair-page size may be equal to ((8192+2048)*Nc) bits, that is, (10240*Nc) bits, and therefore may be equal to (1280*Nc) bytes (e.g. (10240/8)=1280), and may be equal to (1.25*Nc) kilobytes (KB) (e.g. (1280/1024)=1.25). In addition, the page size (e.g. the size of a logical page within the set of logical pages) may be equal to the total memory cell count (Nc*(Ns/4)) of the Nc groups of memory cells GP(1), GP(2), and GP(Nc), and therefore may be equal to (2560*Nc) bits, that is, (320*Nc) bytes.

For example, when Nc=64, the hybrid page size such as the pair-page size may be equal to (1.25*64) KB, that is, 80 KB, and the page size may be equal to 20 KB (e.g. (80/4)=20). In this situation, within the memory cells M(1, ny, nz), . . . , and M(Nx, ny, nz) of the word line WL(ny, nz), 131072 memory cells (e.g. (8192/4)*64=131072) are arranged to store 64 messages, and 32768 memory cells (e.g. (2048/4)*64=32768) are arranged to store 64 parties (or parity codes), but the present invention is not limited thereto. In some examples, the value of Nc may vary, and the associated parameters such as the hybrid page size, the page size, etc. may vary correspondingly. For brevity, similar descriptions for this embodiment are not repeated in detail here.

According to some embodiments, the memory controller 110 may utilize the ECC chunk arrangement circuit 114A to perform the information arrangement, such as the chunk arrangement of the chunk arrangement control scheme shown the lower half of in FIG. 6, the bit arrangement of the bit arrangement control scheme shown in FIG. 7, etc. In addition, the ECC and randomizer circuit 114E may comprise an ECC encoder and an ECC decoder that are arranged to perform ECC encoding operations and ECC decoding operations, respectively. The ECC and randomizer circuit 114E may further comprise a randomizer and a de-randomizer that are arranged to perform randomizing operations and de-randomizing operations, respectively. Additionally, the memory controller 110 may utilize the ECC encoder in the ECC and randomizer circuit 114E to perform encoding on the Nc subsets of the data, such as the respective Nm-bit-messages of the Nc ECC chunks ECCC(1), ECCC(2), . . . , and ECCC(Nc), to generate the respective Np-bit-parities (or Np-bit-parity codes) of the Nc ECC chunks ECCC(1), ECCC(2), . . . , and ECCC(Nc). For example, the ECC encoder in the ECC and randomizer circuit 114E may combine the Nm-bit-messages with the Np-bit-parities (or Np-bit-parity codes) to generate the Ns-bit-codewords, respectively, and utilize the Ns-bit-codewords as the Nc ECC chunks ECCC(1), ECCC(2), . . . , and ECCC(Nc), respectively.

Figure 9:
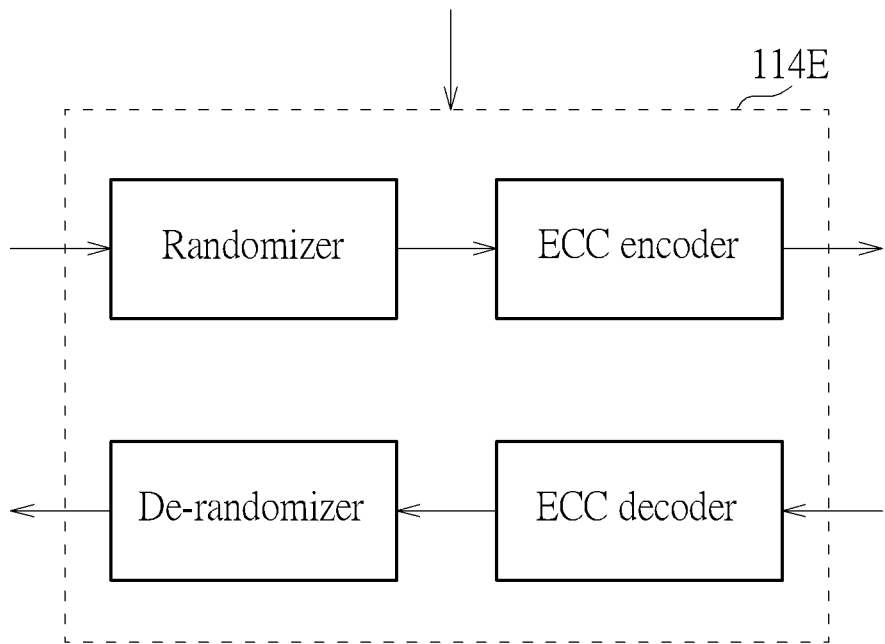
FIG. 9 illustrates an access control scheme of the method according to an embodiment of the present invention.

FIG. 9 illustrates an access control scheme of the method according to an embodiment of the present invention. Based on this access control scheme, during writing the data into the NV memory 120, the memory controller 110 may utilize the randomizer to perform the randomizing operations first, and then utilize the ECC encoder to perform the ECC encoding operations, but the present invention is not limited thereto. In addition, during reading the data from the NV memory 120, the memory controller 110 may utilize the ECC decoder to perform the ECC decoding operations first, and then utilize the de-randomizer to perform the de-randomizing operations, but the present invention is not limited thereto.

Figure 10:
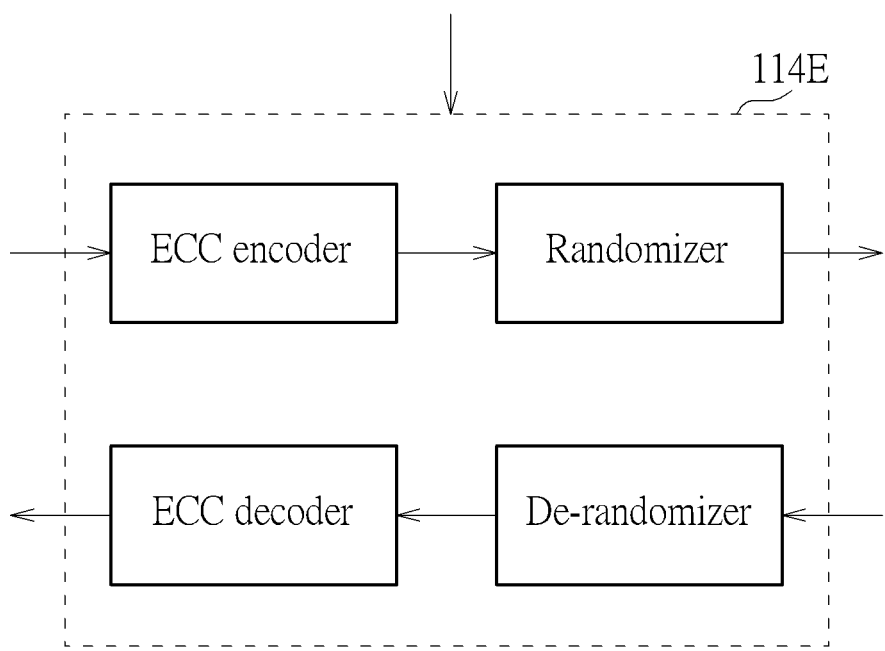
FIG. 10 illustrates an access control scheme of the method according to another embodiment of the present invention.

FIG. 10 illustrates an access control scheme of the method according to another embodiment of the present invention. Based on this access control scheme, during writing the data into the NV memory 120, the memory controller 110 may utilize the ECC encoder to perform the ECC encoding operations first, and then utilize the randomizer to perform the randomizing operations, but the present invention is not limited thereto. In addition, during reading the data from the NV memory 120, the memory controller 110 may utilize the de-randomizer to perform the de-randomizing operations first, and then utilize the ECC decoder to perform the ECC decoding operations, but the present invention is not limited thereto.

Figure 11:
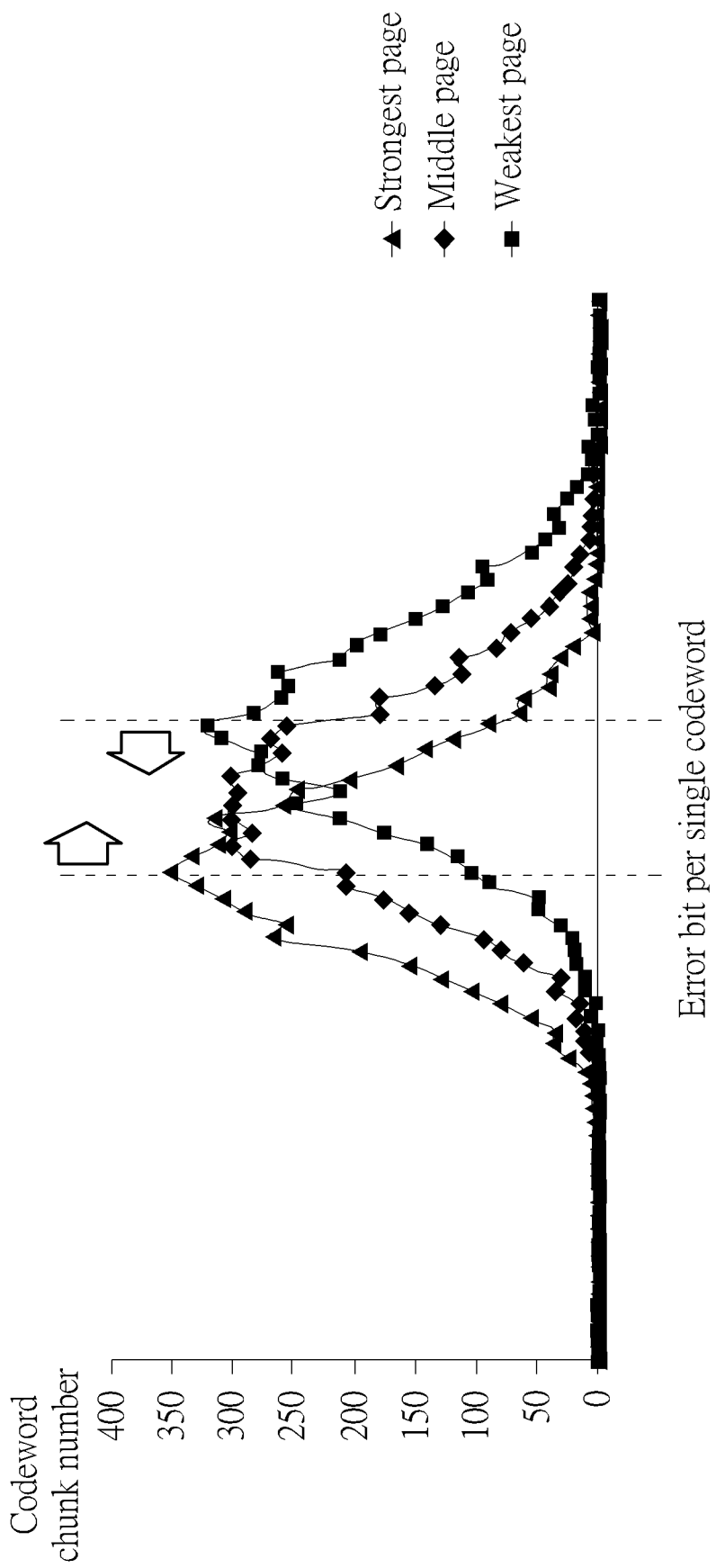
FIG. 11 illustrates curves related to system reliability enhancement of the method according to an embodiment of the present invention.

FIG. 11 illustrates curves related to system reliability enhancement of the method according to an embodiment of the present invention, where the horizontal axis may represent error bit per single codeword, and the vertical axis may represent codeword chunk number. Before the method is applied to the access control of the NV memory 120, the curves shown in FIG. 11 may be originally not aligned to each other and the peaks of these curves may be originally far from each other, for example, due to the logic bit-to-physical cell mapping in the related art. Based on the method, the memory controller 110 may utilize the ECC chunk arrangement circuit 114A to perform the information arrangement, such as the chunk arrangement of the chunk arrangement control scheme shown the lower half of in FIG. 6, the bit arrangement of the bit arrangement control scheme shown in FIG. 7, etc., and may utilize the ECC and randomizer circuit 114E to perform the ECC encoding operations and the randomizing operations during writing the data into the NV memory 120. In addition, the memory controller 110 may read the data according to the information arrangement of the ECC chunk arrangement circuit 114A, and may utilize the ECC chunk arrangement circuit 114A to perform the ECC decoding operations and the de-randomizing operations during reading the data from the NV memory 120. As a result, the memory controller 110 can move one or more curves within the curves respectively corresponding to the weakest page, the strongest page and at least one other page (e.g. the middle page), such as the curve corresponding to the weakest page and the curve corresponding to the strongest page, to make the peaks of the curves shown in FIG. 11 be more close to each other, in order to enhance the system reliability of the memory device 100. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing access management of a memory device aid of information arrangement, the memory device comprising a non-volatile (NV) memory and a memory controller for controlling the accessing of the memory device, the NV memory comprising at least one NV memory element, the method comprising:

when a host device sends a write command to the memory device, utilizing the memory controller to generate a plurality of error correction code (ECC) chunks according to data of the write command, each ECC chunk comprising a codeword formed of message bits and parity bits, and establishing one-to-one mapping between the plurality of ECC chunks and a plurality of sets of memory cells of the NV memory; and utilizing the memory controller to store each ECC chunk of the plurality of ECC chunks into a corresponding set of memory cells of the plurality of sets of memory cells according to the one-to-one mapping, so that any two ECC chunks of the plurality of ECC chunks do not share a same set of memory cells of the plurality of sets of memory cells, to enhance read performance of the memory controller regarding the data;

wherein each memory cell within each set of memory cells stores a plurality of bits belonging to four logical pages, and each ECC chunk is stored in a corresponding set of memory cells by storing a first bit of the codeword in the first logical page, storing a second bit of the codeword in the second logical page, storing a third bit of the codeword in the third logical page and storing a fourth bit of the codeword in the fourth logical page, so that the message bits and parity bits of the codeword are distributed evenly over the four logical pages;

wherein the plurality of sets of memory cells is further arranged to store a hybrid page corresponding to the four logical pages.

2. The method of claim 1, wherein the one-to-one mapping comprises one-to-one mapping relationships between the plurality of ECC chunks and the plurality of sets of memory cells, respectively.

3. The method of claim 1, wherein each memory cell within the plurality of sets of memory cells is arranged to store a plurality of bits.

4. The method of claim 3, wherein any ECC chunk of the plurality of ECC chunks comprises respective bits of a set of memory cells within the plurality of sets of memory cells.

5. The method of claim 3, wherein any ECC chunk of the plurality of ECC chunks comprises a two-dimensional (2D) array of bit information formed with respective bits of a set of memory cells within the plurality of sets of memory cells.

6. The method of claim 1, wherein the memory controller controls the NV memory to access the plurality of sets of memory cells through a same word line of a plurality of word lines within the NV memory.

7. The method of claim 6, wherein the memory controller controls the NV memory to access the plurality of sets of memory cells through a plurality of bit lines within the NV memory, respectively.

8. The method of claim 6, wherein the memory controller controls the NV memory to access any memory cell within the plurality of sets of memory cells through a corresponding bit line of a plurality of bit lines within the NV memory.

9. The method of claim 1, wherein the memory controller controls the NV memory to access any memory cell within the plurality of sets of memory cells through a corresponding bit line of a plurality of bit lines within the NV memory.

10. The method of claim 9, wherein said any memory cell within the plurality of sets of memory cells is arranged to store a plurality of bits.

11. A memory device, comprising:

a non-volatile (NV) memory, arranged to store information, wherein the NV memory comprises at least one NV memory element; and a memory controller, coupled to the NV memory, arranged to control operations of the memory device, wherein the memory controller comprises:

a processing circuit, arranged to control the memory controller according to a plurality of host commands from a host device, to allow the host device to access the NV memory through the memory controller, wherein:

when the host device sends a write command to the memory device, the memory controller generates a plurality of error correction code (ECC) chunks according to data of the write command, each ECC chunk comprising a codeword formed of message bits and parity bits, and establishing one-to-one mapping between the plurality of ECC chunks and a plurality of sets of memory cells of the NV memory, wherein the plurality of host commands comprises the write command; and the memory controller stores each ECC chunk of the plurality of ECC chunks into a corresponding set of memory cells of the plurality of sets of memory cells according to the one-to-one mapping, so that any two ECC chunks of the plurality of ECC chunks do not share a same set of memory cells of the plurality of sets of memory cells, to enhance read performance of the memory controller regarding the data;

wherein each memory cell within each set of memory cells stores a plurality of bits belonging to four logical pages, and each ECC chunk is stored in a corresponding set of memory cells by storing a first bit of the codeword in the first logical page, storing a second bit of the codeword in the second logical page, storing a third bit of the codeword in the third logical page and storing a fourth bit of the codeword in the fourth logical page, so that the message bits and parity bits of the codeword are distributed evenly over the four logical pages;

wherein the plurality of sets of memory cells is further arranged to store a hybrid page corresponding to the four logical pages.

12. The memory device of claim 11, wherein the one-to-one mapping comprises one-to-one mapping relationships between the plurality of ECC chunks and the plurality of sets of memory cells, respectively.

13. The memory device of claim 11, wherein each memory cell within the plurality of sets of memory cells is arranged to store a plurality of bits.

14. The memory device of claim 11, wherein the memory controller controls the NV memory to access the plurality of sets of memory cells through a same word line of a plurality of word lines within the NV memory.

15. An electronic device comprising the memory device of claim 11, and further comprising:

the host device, coupled to the memory device, wherein the host device comprises:

at least one processor, arranged for controlling operations of the host device; and a power supply circuit, coupled to the at least one processor, arranged for providing power to the at least one processor and the memory device;

wherein the memory device provides the host device with storage space.

16. A controller of a memory device, the memory device comprising the memory controller and a non-volatile (NV) memory, the NV memory comprising at least one NV memory element, the memory controller comprising:

a processing circuit, arranged to control the memory controller according to a plurality of host commands from a host device, to allow the host device to access the NV memory through the memory controller, wherein:

when the host device sends a write command to the memory device, the memory controller generates a plurality of error correction code (ECC) chunks according to data of the write command, each ECC chunk comprising a codeword formed of message bits and parity bits, and establishing one-to-one mapping between the plurality of ECC chunks and a plurality of sets of memory cells of the NV memory, wherein the plurality of host commands comprises the write command; and the memory controller stores each ECC chunk of the plurality of ECC chunks into a corresponding set of memory cells of the plurality of sets of memory cells according to the one-to-one mapping, so that any two ECC chunks of the plurality of ECC chunks do not share a same set of memory cells of the plurality of sets of memory cells, to enhance read performance of the memory controller regarding the data;

wherein each memory cell within each set of memory cells stores a plurality of bits belonging to four logical pages, and each ECC chunk is stored in a corresponding set of memory cells by storing a first bit of the codeword in the first logical page, storing a second bit of the codeword in the second logical page, storing a third bit of the codeword in the third logical page and storing a fourth bit of the codeword in the fourth logical page, so that the message bits and parity bits of the codeword are distributed evenly over the four logical pages;

wherein the plurality of sets of memory cells is further arranged to store a hybrid page corresponding to the four logical pages.

* * * * *